US010438846B2

United States Patent
Yang et al.

(10) Patent No.: US 10,438,846 B2
(45) Date of Patent: Oct. 8, 2019

(54) PHYSICAL VAPOR DEPOSITION PROCESS FOR SEMICONDUCTOR INTERCONNECTION STRUCTURES

(71) Applicant: Taiwan Semiconductor Manufacturing Co., Ltd., Hsinchu (TW)

(72) Inventors: Nai-Hao Yang, Keelung (TW); Hung-Wen Su, Jhubei (TW); Kuan-Chia Chen, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/880,324

(22) Filed: Jan. 25, 2018

(65) Prior Publication Data

US 2019/0164825 A1    May 30, 2019

Related U.S. Application Data

(60) Provisional application No. 62/591,257, filed on Nov. 28, 2017.

(51) Int. Cl.
| | |
|---|---|
| *H01L 21/768* | (2006.01) |
| *H01L 21/28* | (2006.01) |
| *H01L 21/324* | (2006.01) |
| *H01L 21/67* | (2006.01) |
| *H01L 23/532* | (2006.01) |
| *H01L 21/285* | (2006.01) |

(52) U.S. Cl.
CPC .... *H01L 21/76877* (2013.01); *H01L 21/2855* (2013.01); *H01L 21/324* (2013.01); *H01L 21/67103* (2013.01); *H01L 23/53238* (2013.01)

(58) Field of Classification Search
CPC .......... H01L 21/76877; H01L 21/2855; H01L 21/324; H01L 21/67103; H01L 23/53238
USPC ...................................................... 257/751
See application file for complete search history.

(56) References Cited

U.S. PATENT DOCUMENTS 5,552,341 A * 9/1996 Lee .................. H01L 21/76843
257/740
6,224,737 B1    5/2001 Tsai et al.
(Continued)

FOREIGN PATENT DOCUMENTS

| KR | 20130126887 A | 11/2013 |
|---|---|---|
| KR | 20170106461 A | 9/2017 |

*Primary Examiner* — Tong-Ho Kim
(74) *Attorney, Agent, or Firm* — Slater Matsil, LLP

(57) ABSTRACT

The present disclosure provides methods for forming a conductive fill material (e.g., a conductive feature) by a physical vapor deposition (PVD) process. In one embodiment, a method of forming a conductive fill material on a substrate includes maintaining a first substrate temperature at a first range for a first period of time while forming a pre-layer of a conductive fill material on a substrate, providing a thermal energy to the substrate to maintain the substrate at a second substrate temperature at a second range for a second period of time, wherein the second substrate temperature is higher than the first substrate temperature, and continuously providing the thermal energy to the substrate to maintain the substrate a third substrate temperature at a third range for a third period of time to form a bulk layer of the conductive fill material on the substrate.

20 Claims, 13 Drawing Sheets

(56) References Cited

U.S. PATENT DOCUMENTS

| | | |
|---|---|---|
| 7,423,347 B2 | 9/2008 | Chen et al. |
| 8,277,619 B2 | 10/2012 | Chang et al. |
| 8,841,211 B2 | 9/2014 | Lee et al. |
| 2002/0093101 A1* | 7/2002 | Iyer .................... H01L 21/2855 257/758 |
| 2004/0134769 A1 | 7/2004 | Wang et al. |
| 2007/0032004 A1* | 2/2007 | Ramaswamy .... H01L 21/76843 438/197 |
| 2008/0190760 A1 | 8/2008 | Tang et al. |
| 2013/0237053 A1 | 9/2013 | Ishizaka et al. |
| 2016/0030766 A1 | 2/2016 | Scritchfield et al. |

* cited by examiner

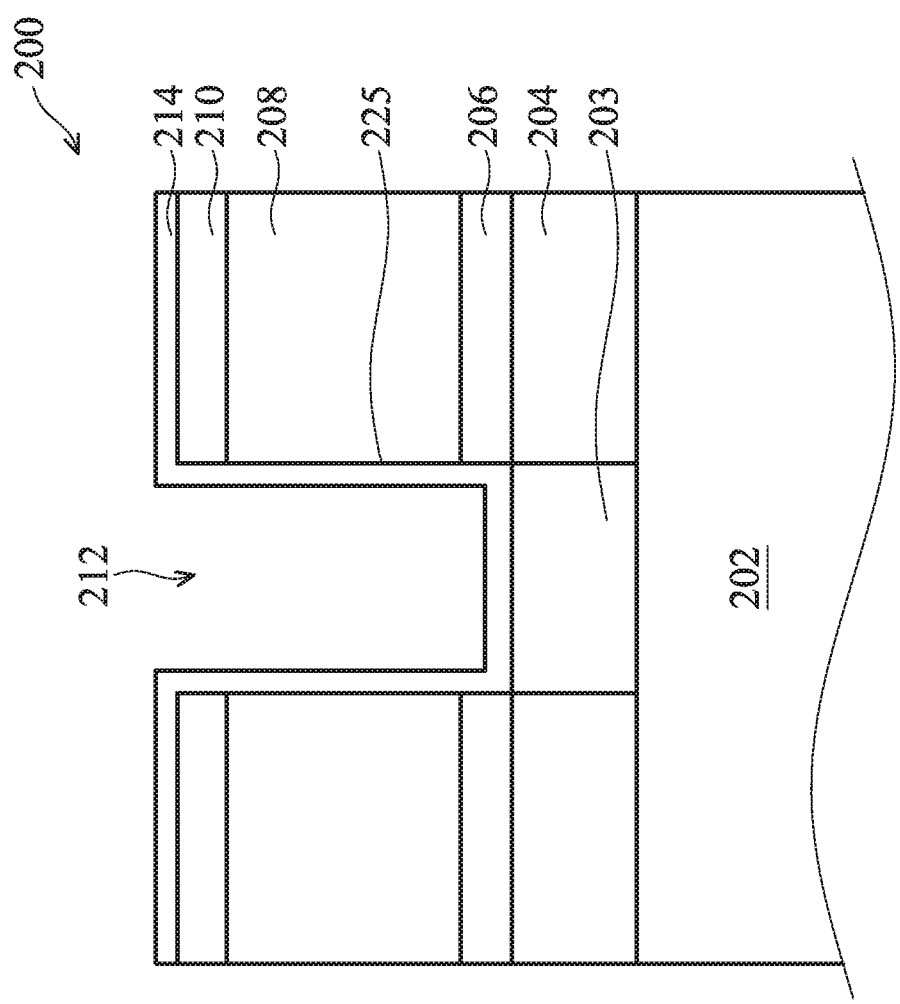

PHYSICAL VAPOR DEPOSITION PROCESS FOR SEMICONDUCTOR INTERCONNECTION STRUCTURES

CROSS-REFERENCE TO RELATED APPLICATIONS

This Application claims the benefit of U.S. Provisional Application 62/591,257 filed on Nov. 28, 2017.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (e.g., the number of interconnected devices per chip area) has generally increased while geometry size (e.g., the smallest component (or line) that can be created using a fabrication process) has decreased. This scaling down process generally provides benefits by increasing production efficiency and lowering associated costs. However, scaling down has also led to challenges that may not have been presented by previous generations at larger geometries. Inaccurate and improper control of the deposition and patterning process during the metallization interconnection fabrication may adversely deteriorate electrical performance of the device structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 2I illustrate cross-sectional views of a semiconductor device at various stages of fabrication in accordance with some embodiments.

DETAILED DESCRIPTION

Figure 1:
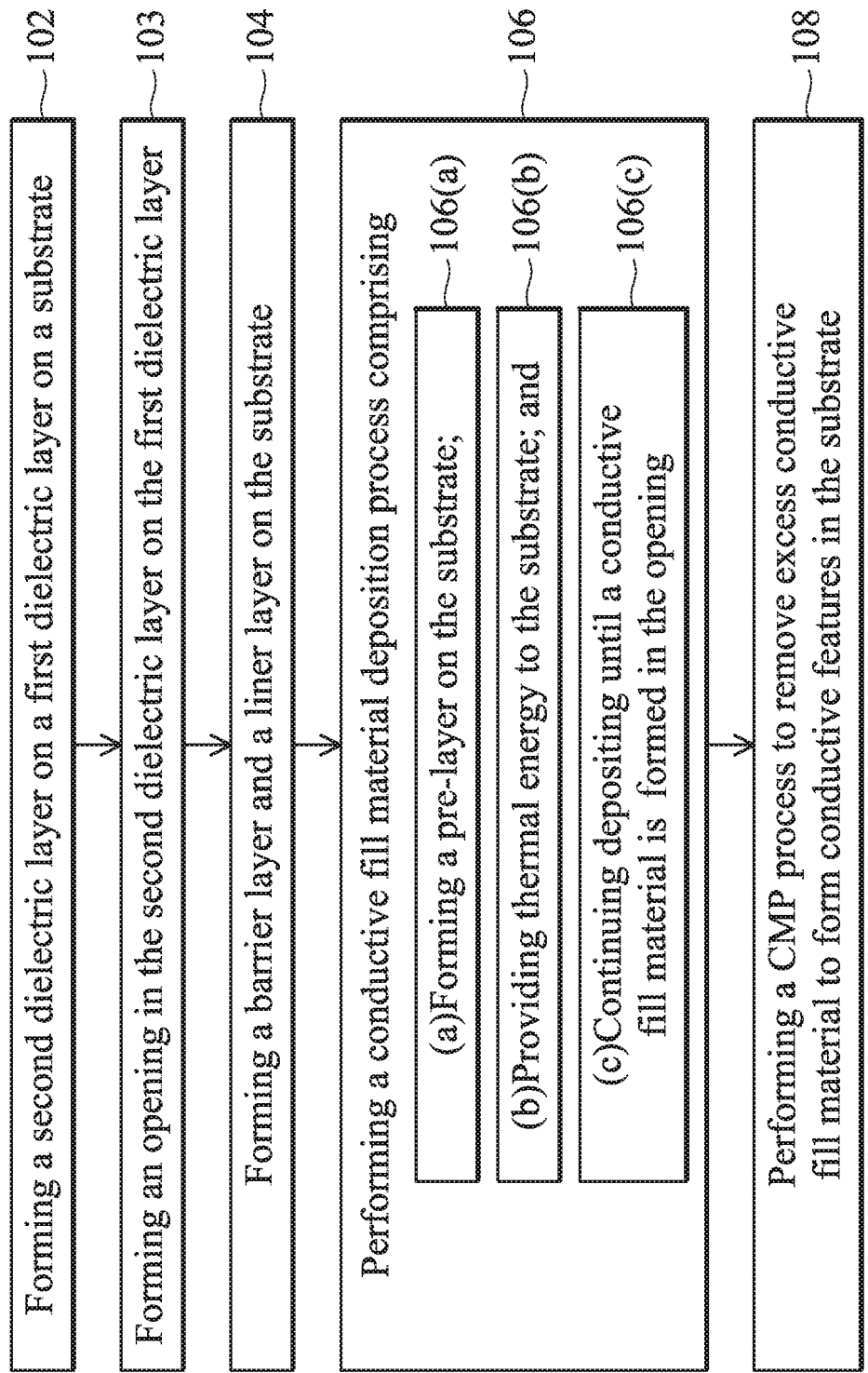
FIG. 1 is a flow chart illustrating an example method for fabricating an interconnect structure of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is generally related to semiconductor devices, and more particularly to interconnection structures formed in semiconductor devices. The present disclosure provides methods for forming a conductive fill material (e.g., a conductive feature) by a physical vapor deposition (PVD) process. The present disclosure provides example embodiments relating to conductive features, such as metal contacts, vias, lines, etc., formed in semiconductor devices and methods for forming those conductive features. More specifically, in some examples, a conductive fill material for a conductive feature can be formed using a physical vapor deposition (PVD) process with multiple steps regulated during the process. A physical vapor deposition (PVD) process used to form the conductive features, in some embodiments, may avoid complicated processes, such as transferring substrates between wet/dry processing chambers which may increase the likelihood of conductive feature oxidation. By utilizing the physical vapor deposition (PVD) process (e.g., a dry process), a seed layer typically utilized prior to forming a conductive fill material using an electroplating process (e.g., a wet process) may be eliminated. Additionally, in some examples, proper control of the physical vapor deposition (PVD) process may assist forming conductive features with minimum void/seams formed in a high aspect ratio opening with high gap fill performance.

Example embodiments described herein are described in the context of forming conductive features (e.g., a conductive fill material) in Back End Of the Line (BEOL) processing. Implementations of some aspects of the present disclosure may be used in other processes. For example, conductive features may be formed in Front End Of the Line (FEOL) processing and/or Middle End Of the Line (MEOL) processing. Some variations of example methods and structures are described. A person having ordinary skill in the art will readily understand other modifications that may be made that are contemplated within the scope of other embodiments. Although method embodiments may be described in a particular order, various other method embodiments may be performed in any logical order and may include fewer or more steps than what is described herein. In some figures, some reference numbers of components or features illustrated therein may be omitted to avoid obscuring other components or features; this is for ease of depicting the figures.

FIG. 1 is a flow chart 100 illustrating an example method for fabricating an interconnect structure of a semiconductor device in accordance with some embodiments. FIGS. 2A to 2I illustrate cross-sectional views of the semiconductor device at various stages of fabrication according to the flow chart of FIG. 1. Those skilled in the art should recognize that the full process for forming a semiconductor device and the associated structures are not illustrated in the drawings or described herein.

Figure 2A:
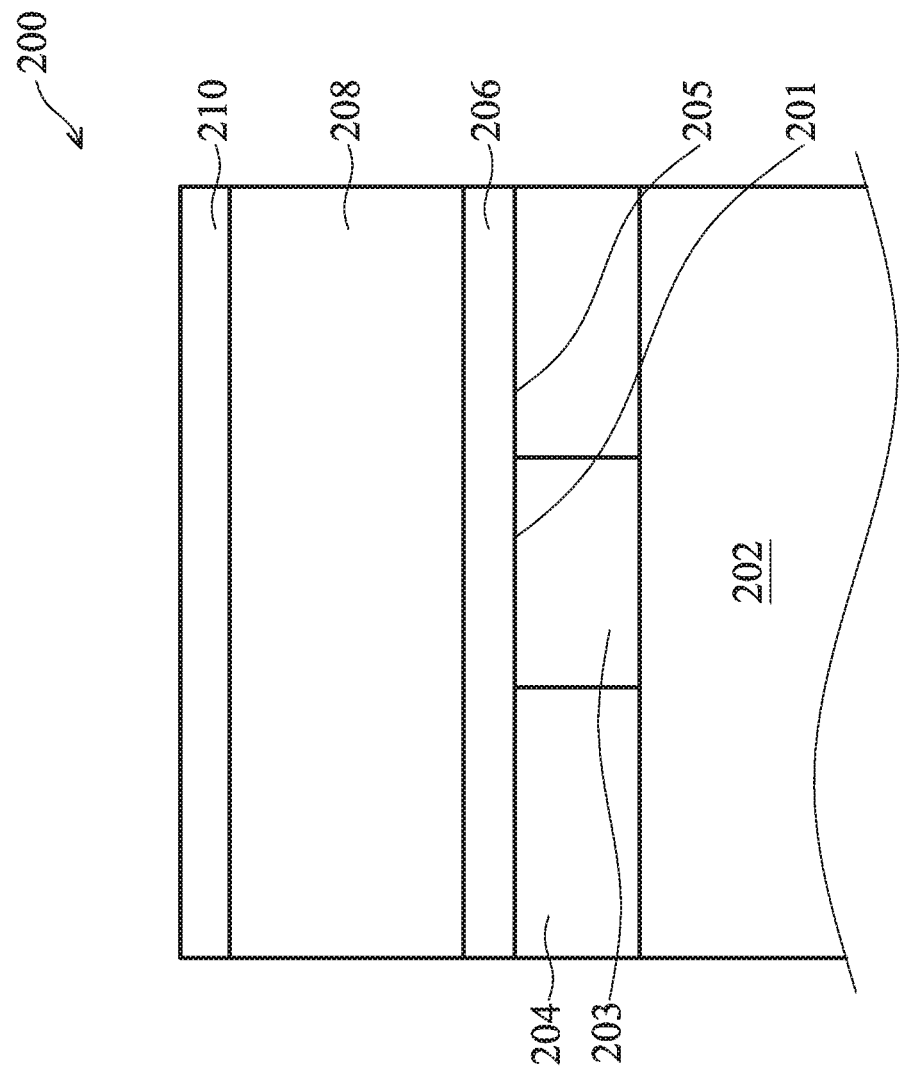

The flow chart 100 begins at operation 102 by forming one or more dielectric layers (e.g., an etch stop layer 206, a second dielectric layer 208, and an anti-reflective coating layer (ARC) 210) over a structure of a semiconductor device 200, as shown in FIG. 2A. The structure of the semiconductor device 200 may include a semiconductor substrate 202 and a first dielectric layer 204 containing an electrically conductive feature 203 formed over the semiconductor substrate 202. The structure of the semiconductor device 200 could be a multi-layered structure at various stages of fabrication of an integrated circuit (IC). For example, the conductive feature 203 may be a portion of an interconnect structure during back end of the line (BEOL) processing, wherein individual devices or components are interconnected with, e.g., metal lines, vias, and/or conductive fill materials. It is noted that additional structures, material layers, or device structures may be formed on the semiconductor substrate 202 prior to forming the first dielectric layer 204 with the conductive feature 203 thereon. For example, a front end of the line (FEOL) structure, such as a gate structure, a contact structure, or other suitable structures may be formed on the semiconductor substrate 202 prior to forming the etch stop layer 206.

The semiconductor substrate 202 can be or include a bulk semiconductor substrate, a semiconductor-on-insulator (SOI) substrate, or another substrate. The semiconductor material of the semiconductor substrate 202 can include or be a material selected from at least one of silicon (e.g., crystalline silicon like Si<100> or Si<111>), silicon germanium, germanium, gallium arsenide, or another semiconductor material. The semiconductor material may be doped or undoped, such as with a p-type or an n-type dopant. In some embodiments wherein a SOI structure is utilized for the semiconductor substrate 202, the semiconductor substrate 202 may include semiconductor material disposed on an insulator layer, which may be a buried insulator disposed in a semiconductor substrate, or which may be a glass or sapphire substrate. In embodiments depicted herein, the semiconductor substrate 202 is a silicon containing material, such as a crystalline silicon substrate. Moreover, the semiconductor substrate 202 is not limited to any particular size, shape, or materials. The semiconductor substrate 202 may be a round/circular substrate having a 200 mm diameter, a 300 mm diameter, or other diameters, such as 450 mm, among others. The semiconductor substrate 202 may also be any polygonal, square, rectangular, curved, or otherwise non-circular workpiece, such as a polygonal substrate as needed.

Various devices may be on the semiconductor substrate 202. For example, the semiconductor substrate 202 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 202, in a portion of the semiconductor substrate 202 and a portion of one or more overlying layers, and/or wholly in one or more overlying layers, for example. Processing described herein may be used to form and/or to interconnect the devices to form an integrated circuit (IC). The integrated circuit can be any circuit, such as for an application specific integrated circuit (ASIC), a processor, memory, or other circuit.

The first dielectric layer 204 formed over the substrate 202 may be one or more layers of any suitable dielectric material. For example, the first dielectric layer 204 may be a single layer including an oxide, a nitride, low-k material, silicon carbon containing material, or other suitable dielectric material. In some examples, the first dielectric layer 204 includes a stack of layers including an oxide, a nitride, low-k dielectric, or other suitable dielectric material. Example materials for the first dielectric layer 204 include, but are not limited to, silicon oxide, silicon carbide, carbon doped silicon oxides, silicon nitride, silicon oxynitride, amorphous carbon, suitable dielectric materials having dielectric constant less than 4, and any combination thereof. For example, the first dielectric layer 204 can be a stack of layers including an etch stop (including, e.g., aluminum oxide and/or aluminum nitride) and a low-k dielectric (including, e.g., carbon doped silicon oxide) over the etch stop. While the first dielectric layer 204 is described as formed over the substrate 202, one or more intervening layers may exist between a surface of the substrate 202 and the first dielectric layer 204. For example, the formation of a first feature over or on a second feature in the description that follows may include embodiments in which the first and second features are formed in direct contact, and may also include embodiments in which additional features may be formed between the first and second features, such that the first and second features may not be in direct contact.

The electrically conductive feature 203 may be formed in the first dielectric layer 204 using any suitable technique, such as a damascene process. The conductive feature 203 of the semiconductor device 200 can be subjected to a polishing process, such as a chemical mechanical polish (CMP) process, so that the top surface 201 of the electrically conductive feature 203 and a top surface 205 of the first dielectric layer 204 are substantially coplanar, as shown in FIG. 2A. The electrically conductive feature 203 may be or include a metal, a metal alloy, a transition metal, a transition metal alloy, or the like. For example, the electrically conductive feature 203 may be formed of copper, aluminum, gold, tungsten, cobalt, nickel, etc. In other examples, the electrically conductive feature 203 is formed of copper, a copper-containing metal, a copper alloy, or a copper-containing alloy. In an example, the electrically conductive feature 203 is copper.

Although in some examples described herein the conductive feature 203, as shown in FIGS. 2A-2I, is utilized in a back end of the line (BEOL) interconnect structure, it is noted that the conductive feature 203 and also the conductive features to be formed thereon in the subsequent processes may also be in any structures, such as a contact structure in an interlayer dielectric (ILD) in Front End Of the Line (FEOL) processing, or other suitable structures.

The etch stop layer 206 is formed over the conductive features 203 and the first dielectric layer 204, as shown in FIG. 2A. The etch stop layer 206 can provide a mechanism to stop an etch process when forming, e.g., vias. The etch stop layer 206 may be formed using any suitable technique, such as a physical vapor deposition (PVD), atomic layer deposition (ALD), chemical vapor deposition (CVD), or plasma enhanced chemical vapor deposition (PECVD). The etch stop layer 206 is chosen to have different etching characteristics (e.g., etch selectivities) than a second dielectric layer 208 to be subsequently formed over the etch stop layer 206 and/or than the first dielectric layer 204. Suitable materials for the etch stop layer 206 may include silicon nitride, silicon carbide, nitrogen-doped silicon carbide, silicon oxynitride, a metal oxide such as hafnium oxide or aluminum oxide, and any combination thereof. It is contemplated that while the etch stop layer 206 is shown as a single layer, the etch stop layer 206 may be a stack of layers including two or more layers of the materials discussed herein and/or other materials.

The second dielectric layer 208 and the anti-reflective coating layer (ARC) 210 are formed in sequence over the etch stop layer 206, as shown in FIG. 2A. The second dielectric layer 208 may be used as an insulating layer. The second dielectric layer 208 may be a low dielectric constant (low-k) layer that has a dielectric constant of less than about 4, such as less than 3.9, for example about 3.2 or less. In some implementations, the second dielectric material 208 is an ultra low-k material, such as a dielectric material having a dielectric constant of less than 2.5. Suitable materials for the second dielectric layer 208 may include, but are not limited to, carbon-doped silicon oxide (e.g., silicon oxycarbide (SiOC), also referred to as organo silicate glass (OSG)), undoped silicate glass (USG), fluorinated silicate glass (FSG), phosphosilicate glass (PSG), borophosphosilicate glass (BPSG), tetraethyl orthosilicate (TEOS) based oxide, spin-on glass (SOG), organic polymer, and any combination thereof. In a case where the etch stop layer 206 is silicon carbide, the second dielectric layer 208 could be, for example, silicon oxycarbide or other material mentioned above that has different resistance to etchants used in the subsequent processes.

The anti-reflective coating layer 210 is used to suppress or minimize reflections from the underlying layers which are reflective to ultraviolet light used in a subsequent lithographic process. Example materials for the anti-reflective coating layer 210 may include silicon oxide, silicon oxycarbide, silicon oxynitride, hydrocarbon-containing silicon oxide, silicon nitride, titanium nitride, tantalum nitride, titanium containing material, tantalum containing material, an organic material, and any combination thereof. In some implementations, the anti-reflective coating layer 210 is a nitrogen-free material, such as a nitrogen-free oxide. In an implementation, the anti-reflective coating layer 210 is a nitrogen-free silicon oxycarbide. The anti-reflective coating layer 210 may be formed over the second dielectric layer 208 using any suitable technique, such as CVD, PECVD, high-density plasma CVD (HDP-CVD), spin-on coating process, etc. A planarization process, such as a CMP process, may be performed to planarize the second dielectric layer 208 and/or the anti-reflective coating layer 210.

Figure 2B:
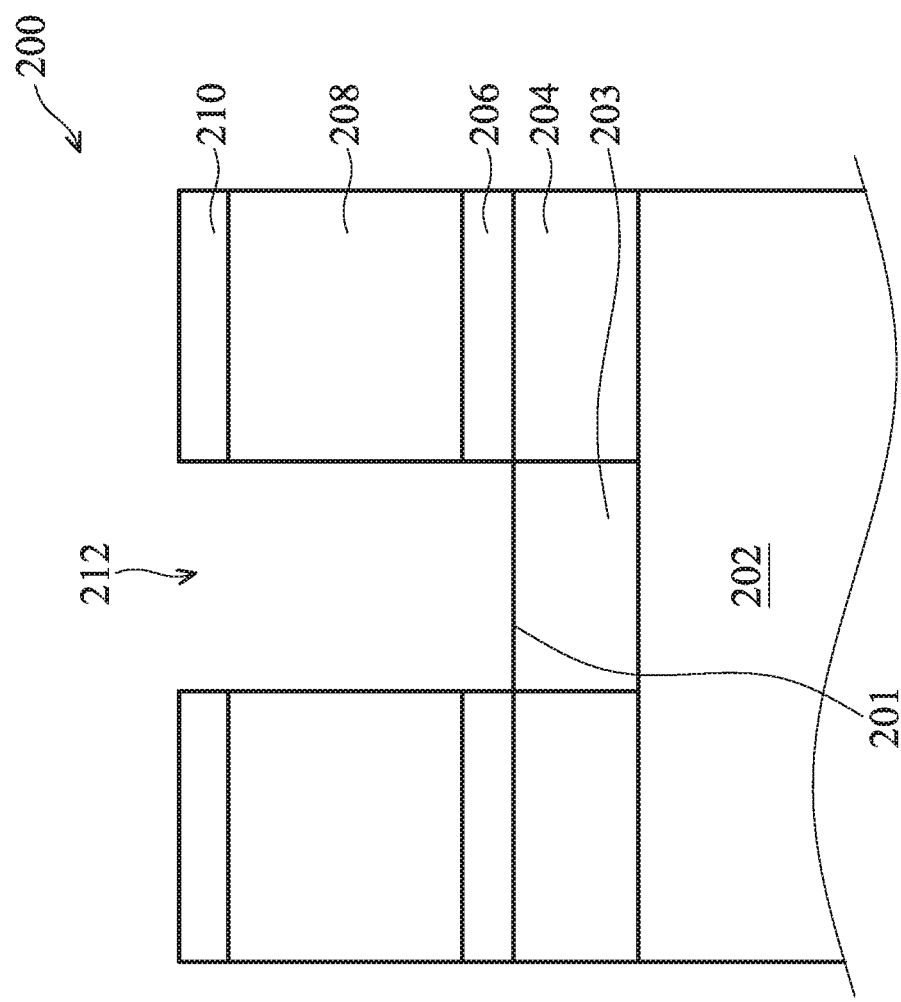

At operation 103, an opening 212 is formed in the second dielectric layer 208. The opening is formed through the ARC 210, the second dielectric layer 208, and the etch stop layer 206, as shown in FIG. 2B. The opening 212 can be formed using a patterned photoresist layer that defines an opening pattern followed by a suitable etching process. The etching process uses etchant gas mixtures and plasma parameters that are utilized to etch the etch stop layer 206. The patterned photoresist layer is then removed using any suitable stripping process. For the sake of clarity, only one opening 212 formed from the second dielectric layer 208 to the etch stop layer 206 is shown in FIG. 2B. It is noted that additional mask layers, including hardmask layer or photoresist layer may be utilized to facilitate forming the opening 212 in the second dielectric layer 208 and the etch stop layer 206. Conductive features may be formed in the opening 212 to electrically connect with the conductive feature 203 formed thereunder. The opening 212 may include any opening, such as including a trench with a via opening to the conductive feature 203, which may be formed using a dual damascene process.

In one implementation, the opening 212 has a height dimension in a range from about 50 angstrom to about 2000 angstrom, such as about 80 angstrom to about 1000 angstrom, and more particularly, from about 100 angstrom to about 500 angstrom. The opening 212 exposes a portion of the top surface 201 of the conductive features 203 to provide an electrical connection. The opening 212 has a width dimension in a range from about 70 angstrom to about 120 angstrom.

Figure 2D:
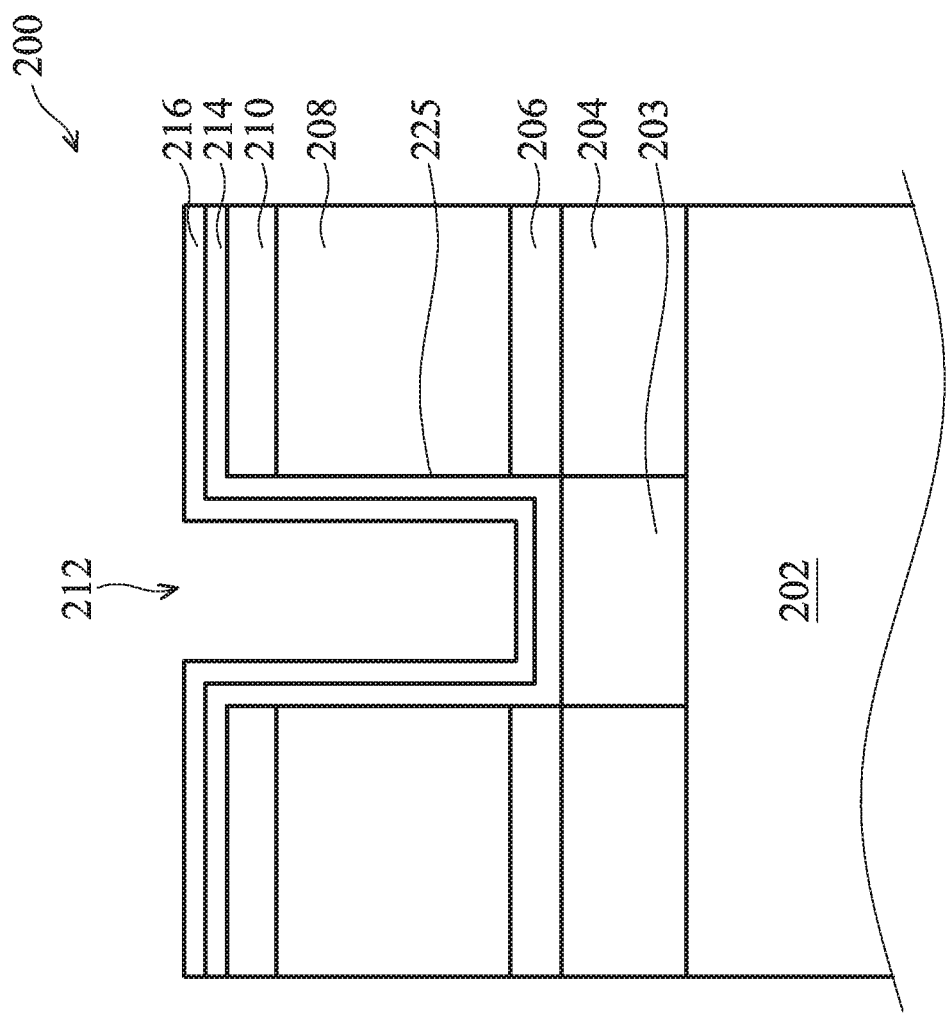

At operation 104, a barrier layer 214 and a liner layer 216 are sequentially formed along sidewalls 225 of the opening 212, as shown in FIGS. 2C and 2D, respectively. The barrier layer 214 can be conformally deposited in the opening 212 (e.g., on sidewall 225 of the opening 212 and exposed surface of the of conductive feature 203) and over the anti-reflective coating layer (ARC) 210 or the second dielectric layer 208, if the ARC 210 is not present, as shown in FIG. 2C. The barrier layer 214 may be or comprise metal containing material, such as titanium containing material, such as titanium nitride or titanium oxide, or tantalum containing material, for example tantalum nitride or tantalum oxide, the like, or a combination thereof, and may be deposited by ALD, CVD, or another deposition technique. The barrier layer 214 may have a thickness in a range from about 5 Å to about 100 Å, such as from about 8 Å to about 50 Å, for example, about 20 Å.

The liner layer 216 can be conformally deposited on the barrier layer 214, as show in FIG. 2D. The liner layer 216 may be a metal containing material, such as cobalt, tungsten, copper, ruthenium, aluminum, gold, silver, alloys thereof, the like, or a combination thereof, and may be deposited by CVD, ALD, PVD, or another deposition technique. The liner layer 216 may have a thickness in a range from about 5 Å to about 100 Å, such as from about 8 Å to about 50 Å, and more particularly, for example, from about 20 Å to about 30 Å. In one example, the liner layer 216 is a ruthenium or cobalt material.

Figure 2E:
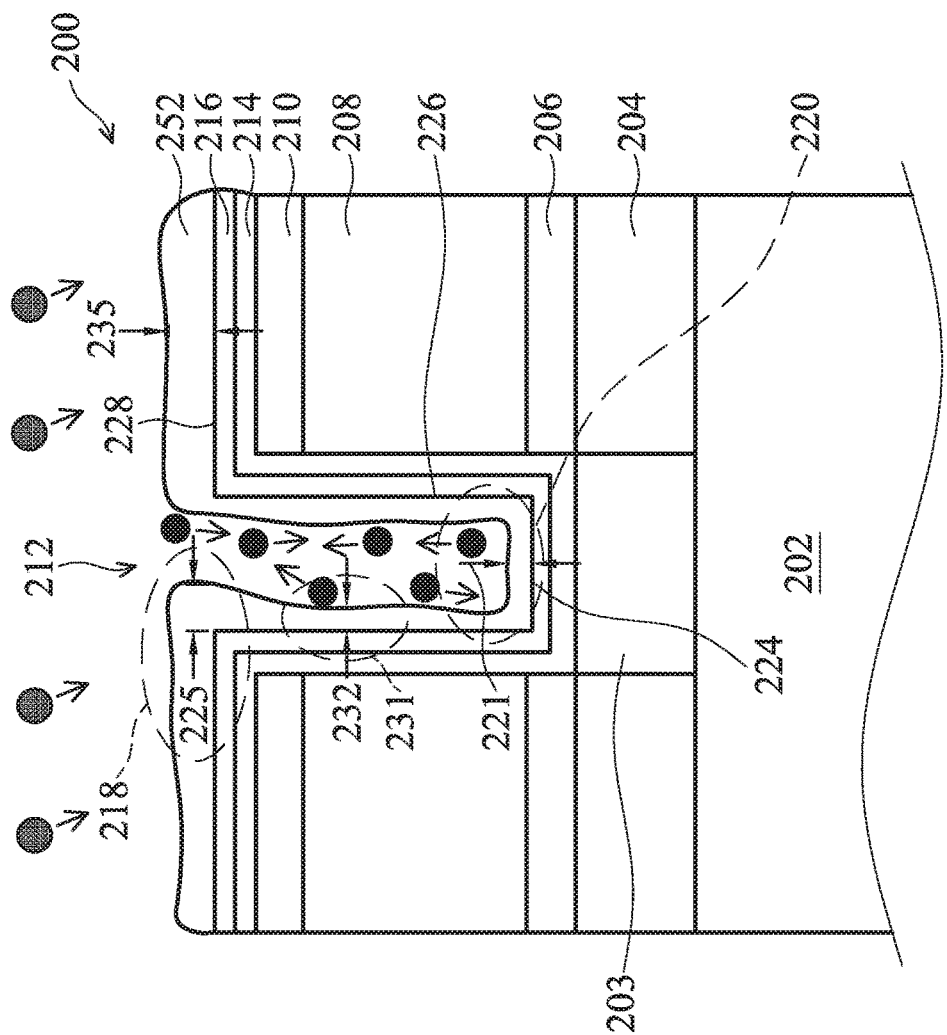
Figure 2F:
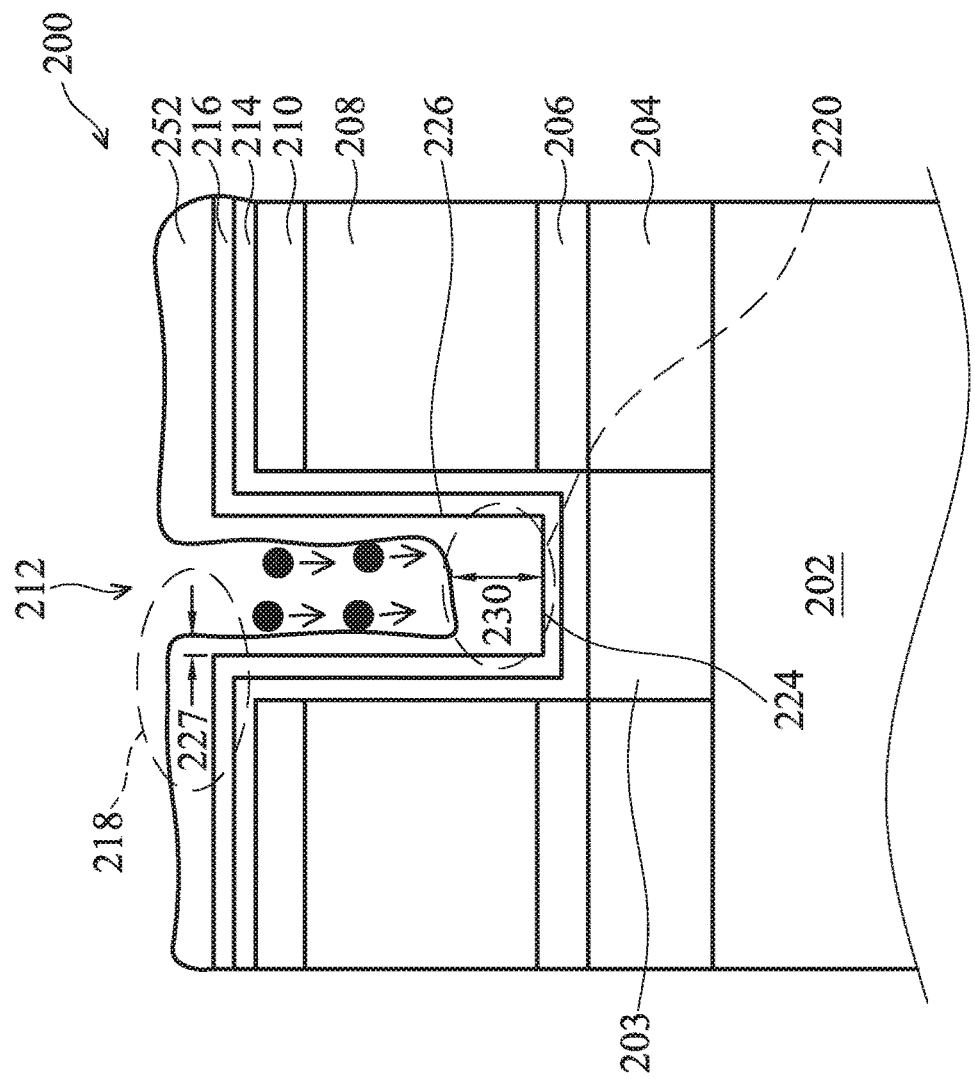

At operation 106, a conductive fill material deposition process is performed. In one example, the conductive fill material may be or comprise cobalt, tungsten, copper, ruthenium, aluminum, gold, silver, alloys thereof, the like, or a combination thereof, and may be deposited by CVD, ALD, PVD, or another deposition technique. In the example described here, the conductive fill material is a copper material formed by a physical vapor deposition (PVD) process comprising three operation stages, as depicted in FIG. 1. At a first operation stage 106(a), a pre-layer 252 of the conductive fill material 253 (as shown in FIG. 2H) is formed on the liner layer 214 in the opening 212 as well as on the top surface of the semiconductor device 200, as shown in FIG. 2E. The pre-layer 252 may be later grown to form a conductive fill material filled in the opening 212, such as upon performance of the three operation stages of the conductive fill material deposition process at operation 106.

At the first operation stage 106(a), the substrate 202 is placed on a substrate support pedestal in a physical vapor deposition (PVD) processing chamber to form the pre-layer 252, as shown in FIG. 2E. The pre-layer 252 is formed at a temperature less than about 50 degrees Celsius, e.g., at room temperature, such as in a range from about 5 degrees Celsius to about 50 degrees Celsius. While forming the pre-layer 252, the heating device in the substrate support pedestal may be turned off, e.g., providing no or minimum thermal energy to the substrate 202. It is believed that room temperature deposition of the pre-layer 252 may prevent the pre-layer 252 from early agglomeration, which is often found in conventional physical vapor deposition (PVD) processing chamber, which can result in undesired overhang structure formed at corners of the openings. By room temperature control of the deposition process at the early stage of forming the pre-layer 252, a relatively smooth and uniform structure of the pre-layer 252 may be formed at the corner portion 218 of the opening 212 as well as at the sidewall portion 231 and bottom portion 220 of the opening 212, as shown in FIG. 2E.

Figure 3A:
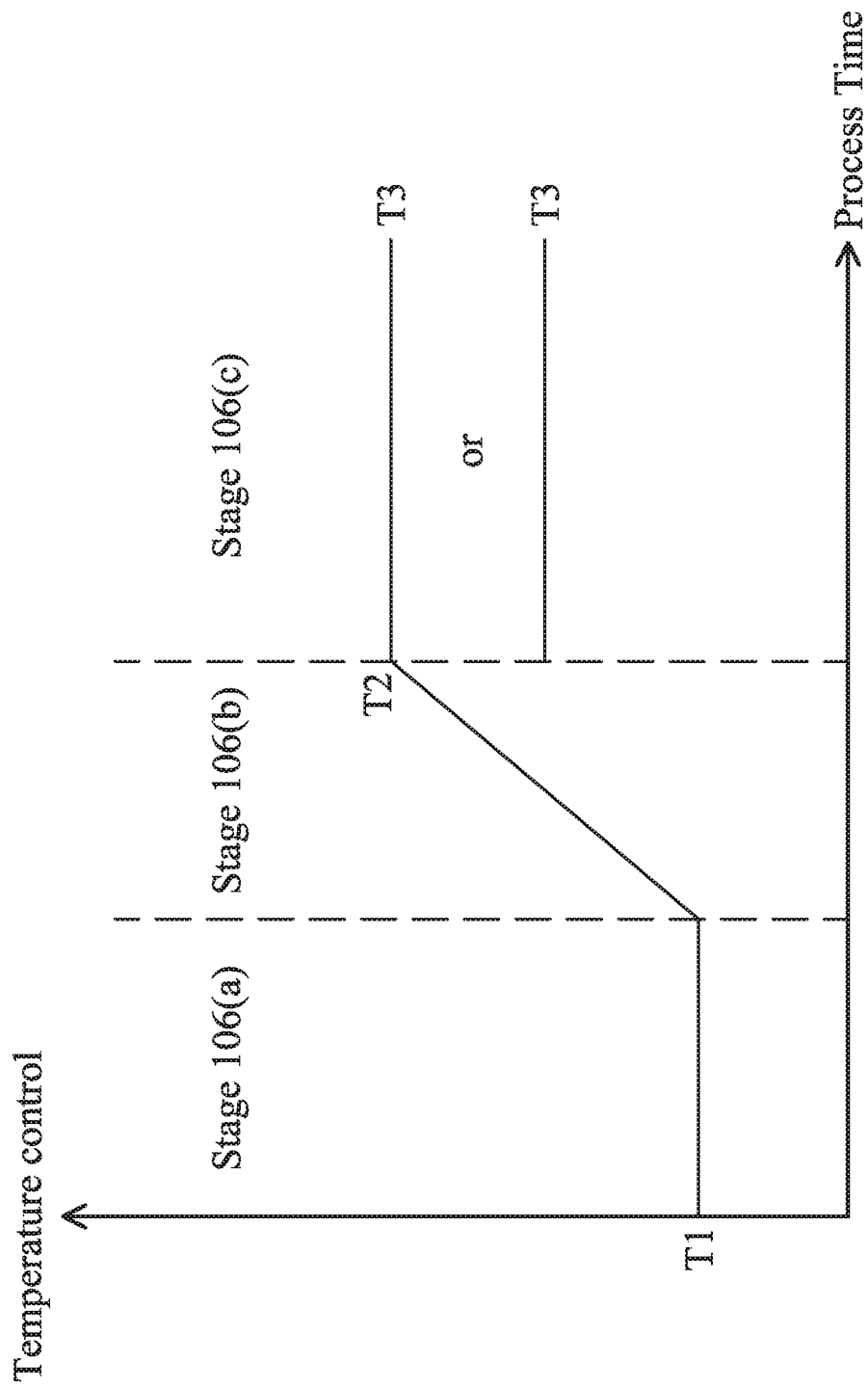
FIG. 3A illustrates a temperature trace chart plotted as a function of process time at different manufacturing stages of FIG. 1 in accordance with some embodiments.

FIG. 3A depicts a temperature trace chart plotted as a function of the processing time at different processing stages of FIG. 1. The relatively low substrate temperature T1, as shown in FIG. 3A, e.g., a temperature less than 50 degrees Celsius (e.g., the room temperature), may allow the elements to be uniformly grown in a steady manner that prevents early agglomeration. Thus, the thickness difference of the pre-layer 252 among the corner portion 218, the bottom portion 220 and the sidewall portion 231 of the opening 212 is relatively small. For example, a thickness 225 of the pre-layer 252 at the corner portion 218 may be controlled about less than 50 percent difference of a thickness 232 of the pre-layer 252 at the sidewall portion 231 (e.g., the thickness difference (ΔTHK between the thickness 225 the thickness 232 less than 50 percent). A thickness 221 of the pre-layer 252 at the bottom portion 220 may be similar, such as less than 30 percent difference, to the thickness 232 of the pre-layer 252 at the sidewall portion 231 or to the thickness 225 of the pre-layer 252 at the corner portion 218.

For example, the thickness 225 of the pre-layer 252 at the corner portion 218 is controlled to be in a range from about 100 Å to about 280 Å, while the thickness 232 of the sidewall portion 231 may be controlled to be in a range from about 80 Å to about 200 Å and the thickness 221 at the bottom portion 220 may be controlled to be in a range from about 80 Å to about 200 Å. The thickness 235 from the surface 228 of the liner layer 216 can be in a range from about 100 Å to about 250 Å, such as about 200 Å, after the room temperature deposition at the first operation stage 106(a) is completed.

In conventional practices, early agglomeration of the elements at the initial stages of the deposition process may create relatively large amount of the elements formed at the corner portion 218 of the opening 212, which may result in early closure of the opening 212 and may form undesired voids or seams within the opening 212. By utilizing the formation of the pre-layer 252 with controlled profiles at the corner portion 218, bottom portion 220, and sidewall portion 231 of the opening 212, a relatively conformal profile of the pre-layer 252 with good step coverage may be obtained.

Figure 3B:
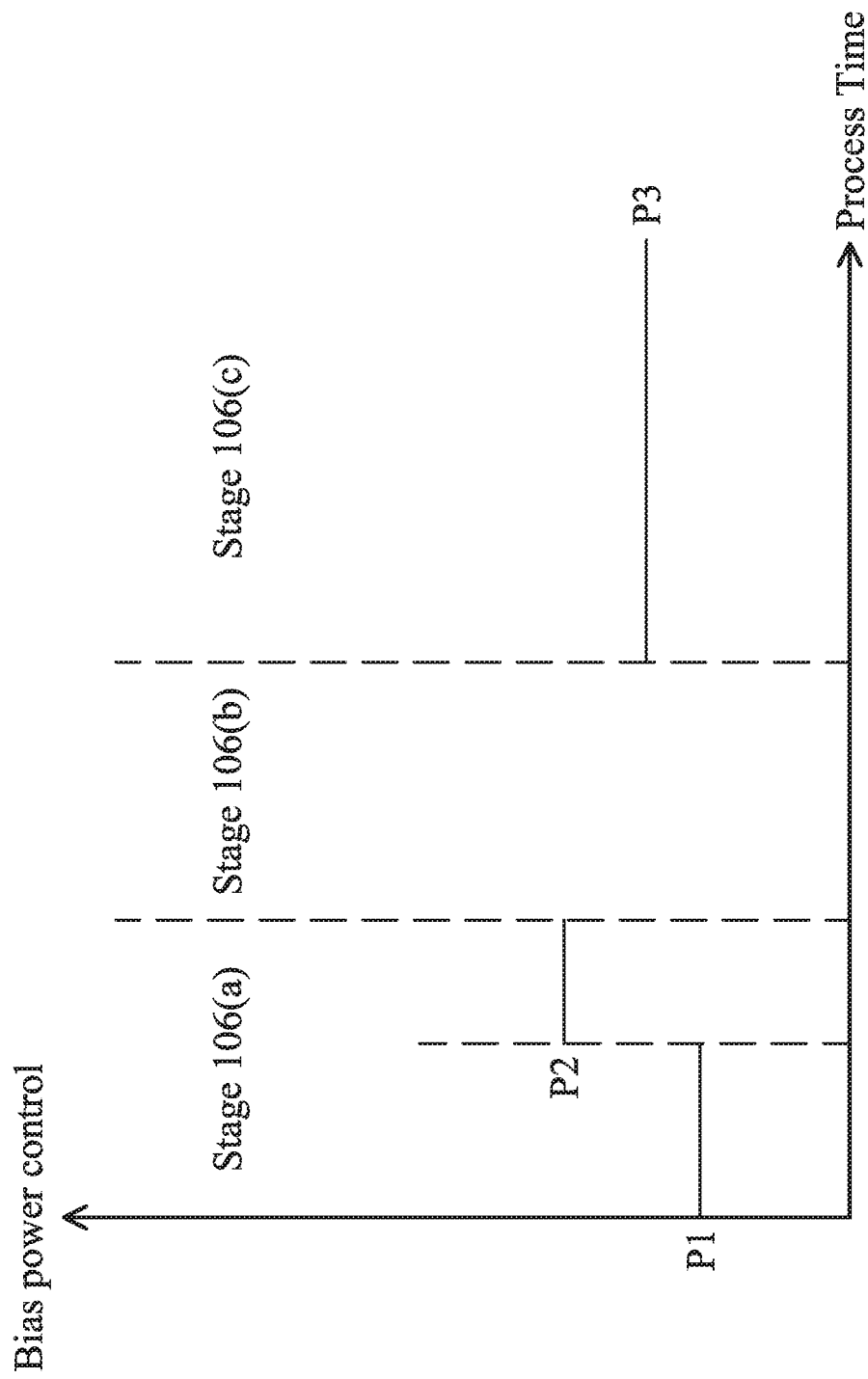
FIG. 3B illustrates a bias power trace chart plotted as a function of process time at different manufacturing stages of FIG. 1 in accordance with some embodiments.

In one example, the room temperature deposition of the pre-layer 252 is performed with a relatively low bias power P1, as shown in FIG. 3B, (e.g., a low bias power deposition regime) supplied to the substrate support pedestal followed by a relatively high bias power (e.g., a high bias power deposition regime). FIG. 3B depicts a bias power trace chart plotted as a function of the processing time at different processing stages of FIG. 1. The low bias power assists the materials dislodged from the target from the processing chamber to be accelerated and pulled toward the substrate in a relatively slower rate, thus allowing the atoms/elements from the target to fall on the substrate slowly and gently. By doing so, a relatively smooth and uniform profile of the pre-layer 252 with a good step coverage is obtained and the likelihood of the early closure of the opening 212 may be eliminated or reduced. Furthermore, the low bias power also prevents the underlying barrier layer 214 and liner layer 216 from damage. The lower bias power applied during the room temperature deposition may be continued for a period of time until the desired thickness of the pre-layer 252 is reached. For example, the lower bias power applied during the room temperature deposition may be terminated when the thickness 235 of the pre-layer 252 from the surface 228 of the liner layer 216 is in a range from about 80 Å to about 150 Å, such as about 130 Å (e.g., a first thickness formed under the low bias power regime). The process time for the lower bias power during the room temperature deposition can be in a range from about 20 seconds to about 100 seconds. During the low bias power regime during the room temperature deposition, a low bias power less than about 100 Watts, such as in a range from about 70 Watts to about 90 Watts, may be applied to the substrate support pedestal bias device to help attract the dislodged materials from the target.

After the low bias power during the room temperature deposition at the first operation stage 106(a), the high bias power P2, as shown in FIG. 3B, may be applied to continue depositing the pre-layer 252. The high bias power applied after the low bias power during the room temperature deposition provides a relatively higher bombardment power to continue depositing the pre-layer 252 as well as smoothen the surface topography of the pre-layer 252, so that the uneven surface agglomeration, if any, may be sputtered off while depositing to provide a relatively uniform surface and thickness across the pre-layer 252, including on the sidewall 226 and the bottom 224 of the opening 212, as shown in FIG. 2E. The high bias power applied during the room temperature deposition at the first operation stage 106(a) may be configured to deposit a thickness of the pre-layer 252 in a range from about 10 Å to about 100 Å, for example from about 65 Å to about 75 Å, such as about 70 Å (e.g., a second thickness formed under the high bias power regime). During the high bias power deposition regime, though the resultant pre-layer 252 can be measured as around 70 Å, it is noted that the actual thickness during the high bias power deposition regime may be greater than 70 Å as a portion of the pre-layer 252 may be sputtered off while depositing the pre-layer 252. It is believed that during the high bias power deposition regime, the thickness formed on the substrate may be in a range from about 450 Å to about 550 Å, such as about 500 Å, but simultaneously sputtering off a thickness in a range from about 375 Å to about 475 Å, thus rendering the resultant pre-layer 252 formed during the high bias power deposition regime in a range from about 65 Å to about 75 Å, such as about 70 Å.

During the high bias power regime during the room temperature deposition, a high bias power greater than about 200 Watts, such as in a range from about 350 Watts to about 600 Watts, for example about 450 Watts, may be applied to the substrate support pedestal bias device to help attract the dislodged materials from the target.

It is noted that the substrate support pedestal is maintained at the same temperature, such as a steady temperature at room temperature less than 50 degrees Celsius, during both the low and high bias power regimes at first operation stage 106(a) to provide the pre-layer 252 having a thickness of about 200 Å (e.g., about 130 Å from the low bias power regime and about 70 Å from the high bias power regime).

While forming the pre-layer 252 at first operation stage 106(a), a process gas comprising non-reactive gas, such as argon or xenon, may be supplied to energetically impinge upon and sputter material from the target. In some examples, the process gas may also comprise a reactive gas, such as one or more of an oxygen-containing gas and a nitrogen-containing gas, that are capable of reacting with the sputtered material. An RF power source, a DC power source, a pulsed DC power source, or a combined power source using RF power and/or DC power or pulsed DC power to apply energy to the target to dislodge materials from the target may be implemented. The sputtered material from the target, which can include metal elements, such as copper as described here, deposits on the substrate 202 and forms a solid layer of metal, such as the pre-layer 252 of the conductive fill material 253. In one example, the non-reactive gas may be supplied at a volumetric flow rate in a range from about 1 sccm to about 50 sccm, such as about 1 sccm to about 20 sccm, during deposition, while a power of an RF power source in a range from about 20 Watts to about 80 Watts may be applied to the target during deposition. It is noted that the process parameters discussed herein are based on a 300 mm substrate. It is contemplated that these process parameters may vary depending upon the thickness of the layers to be formed, the size of the openings, the size of the substrate, the capability of the plasma reactor, and/or the application.

Subsequently, after the pre-layer 252 is reached to the desired thickness, at the second operation stage 106(b), thermal energy is provided to the substrate 202. The thermal energy may be provided to the substrate 202 by turning on the heating device embedded in the substrate support pedestal so as to provide thermal energy to the substrate 202. Thus, temperature control of the heating device in the substrate support pedestal at the second operation stage 106(b) is greater than the temperature control at the first operation stage 106(a), such as greater than room temperature (e.g., greater than 50 degrees Celsius). During the second operation stage 106(b), other process parameters regulated during the first operation stage 106(a) may be terminated, allowing the thermal energy to be provided to the substrate 202. The thermal energy provided to the substrate 202 softens and/or mildly melt the metal elements from the pre-layer 252, thus allowing the pre-layer 252 to reflow in the opening 212, as shown in FIG. 2F. The thermal energy provided to the substrate 202 promotes a pre-layer reflowing process so as to promote and increase thickness conformity across the pre-layer 252. The metal elements melted and/or reflowed from the pre-layer 252 allows the profile of the pre-layer 252 to be further altered, allowing more amount of the metal elements flowing down to the bottom 224 of the opening 212. As a result, the thickness 230 of the pre-layer 252 at the bottom portion 220 is increased, as the gravity pulls the mildly melted pre-layer 252 reflowing downward to the bottom 224 of the opening 212, while the thickness 227 at the corner portion 218, mostly, is decreased, as shown in FIG. 2F.

In an example, the thickness 230 at the bottom portion 220 may be increased in a range from about 20 percent to about 50 percent compared to the thickness 221 at the bottom portion 220 prior to the reflow process in FIG. 2E. In an example, the thickness 230 at the bottom portion 220 during the reflowing process at the second operation stage 106(b) is in a range from about 96 Å to about 300 Å.

In an embodiment, the thermal energy may be supplied to the substrate 202 by controlling the substrate temperature T2, as shown in FIG. 3A, greater than the substrate temperature T1. The substrate temperature T2 is controlled by controlling the heating device of the substrate support pedestal, where the substrate 202 is positioned, such as in a range from about 90 degrees Celsius to about 400 degrees Celsius. In the example wherein a relatively mild temperature reflowing process is performed, the heating device of the substrate support pedestal is controlled to be in a range from about 90 degrees Celsius to about 200 degrees Celsius.

The temperature T2 at this stage may be gradually ramped up, as shown in FIG. 3A, to steadily increase the thermal energy supplied to the substrate 202. In contrast, in an example wherein a relatively high temperature reflowing process is performed, the heating device of the substrate support pedestal is controlled to be in a range from about 200 degrees Celsius to about 400 degrees Celsius. It is believed that the decreased thickness 227 at the corner portion 218 of the opening 212 reduces the overhang structures and enlarges the dimensions at the top portion of the opening 212, thus allowing the materials subsequently dislodged from the target to be successfully deposited and filled into the opening 212.

In an embodiment, the reflowing process at the second operation stage 106(b) may be performed in the same processing chamber or different processing chamber where the pre-layer 252 is formed at the first operation stage 106(a). In one specific example described here, the reflowing process at the second operation stage 106(b) is performed at a different processing chamber where the pre-layer 252 is formed at the first operation stage 106(a) due to different temperature settings at the substrate support pedestal. In an example, the reflowing process at the second operation stage 106(b) may be performed in any suitable heating devices, such as a heater, baking plate, a thermal plate, or the like. In another example, the reflowing process at the second operation stage 106(b) may be performed in another processing chamber, such as another physical vapor deposition (PVD) processing chamber, so as to facilitate performing the next step process at the third operation stage of 106(c) in the same processing chamber.

In an example, the reflowing process at the second operation stage 106(b) may be performed in a range from about 20 seconds to about 60 seconds, such as about 40 seconds. During the reflowing process, the temperature may be ramped up from T1 to T2 in a linear fashion, and/or in a step-wise fashion, at the second operation stage 106(b). For example, the temperature T1 may be ramped up linearly to the temperature T2 at the time period between about 20 seconds to about 60 seconds. Alternatively, the temperature T1 may be ramped up to the temperature T2 by a step-wise control, such as discretely increasing 5 degrees Celsius to 8 degrees Celsius in every second. In one particular example, the temperature T1 to temperature T2 at second operation stage 106(b) is ramped up linearly.

Figure 2G:
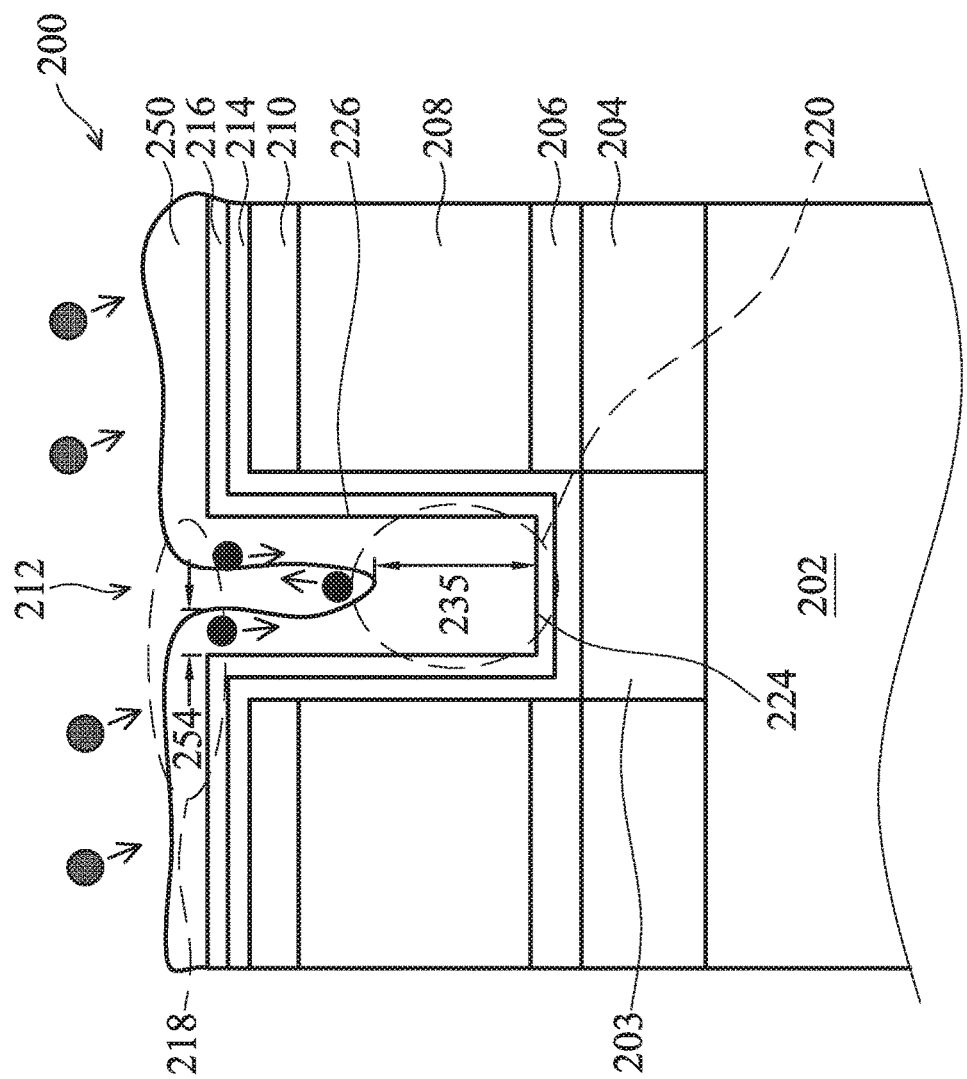
Figure 2H:
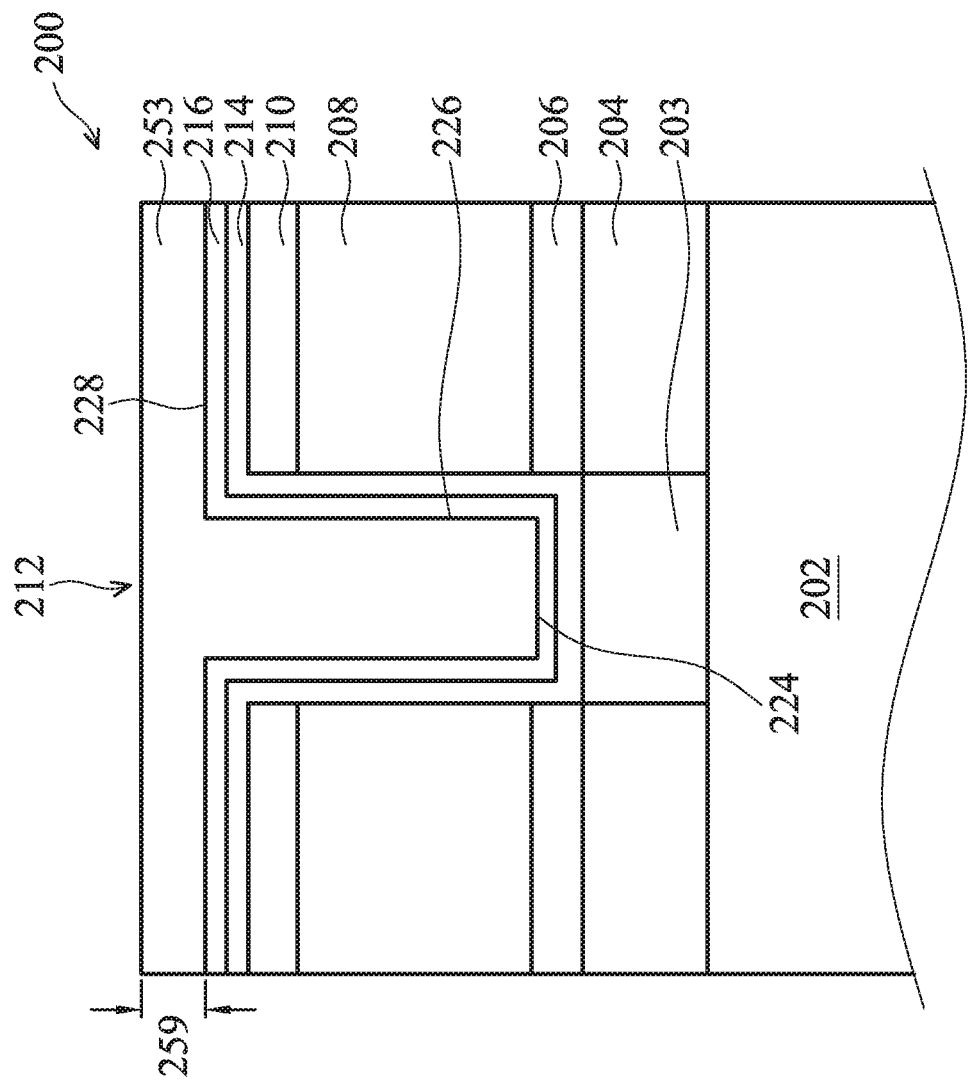

At third operation stage 106(c), the deposition of the physical deposition process, similar to the pre-layer deposition process at first operation stage 106(a), is performed, as shown in FIG. 2G, to form a bulk layer 250 until a conductive fill material 253 is filled and formed in the opening 212, as shown in FIG. 2H. The process parameters at the third operation stage 106(c) are substantially similar to the process parameters at the first operation stage 106(a) except the control of the thermal energy, such as the substrate temperature T3, as shown in FIG. 3A, e.g., the temperature control of the heating device in the substrate support pedestal and the bias power P3, as shown in FIG. 3B, provided to the substrate 202.

The temperature control to the substrate 202 at the third operation stage 106(c) may be similar to, higher or lower than the temperature control at the second operation stage 106(b), but higher than the temperature control at the first operation stage 106(a). In other words, the substrate temperature control at the third operation stage 106(c) is greater than room temperature, such as greater than 50 degrees Celsius. In an example, the temperature control of the heating device in the substrate support pedestal at the third operation stage 106(c) is in a range from about 90 degrees Celsius to about 200 degrees Celsius, while the temperature control at the second operation stage 106(b) is also in a range from about 90 degrees Celsius to about 400 degrees Celsius, and, at the first operation stage 106(a), is less than 50 degrees Celsius, such as room temperature. Thus, the temperature control at the second and the third operation stage 106(b), 106(c) is configured to be greater the temperature control at the first operation stage 106(a). It is believed that the substrate temperature has a positive correlation (e.g., proportional) to the temperature setting to the heating device in the substrate support pedestal where the substrate is positioned.

In a specific example, the temperature control to the heating device in the substrate support pedestal (i) at the third operation stage 106(c) is in a range from about 90 degrees Celsius to about 200 degrees Celsius, (ii) at the second operation stage 106(b) is in a range from about 200 degrees Celsius and about 400 degrees Celsius, and (iii) at the first operation stage 106(a) is less than 50 degrees Celsius, such as at room temperature, as shown in FIG. 3A.

Thus, while resuming the deposition process to continue growing the pre-layer 252 to the bulk layer 250, as shown in FIG. 2G, the high temperature from the substrate 202 allows the material dislodged from the target to be formed in the opening 212 while continuously melting and/or reflowing the pre-layer 252 formed on the substrate 202. By using temperature control (e.g., the amount of the thermal energy provided) to the substrate 202, a deposition process as well as a reflowing process may be obtained to allow the bulk layer 250 to be filled in the opening 212, as shown in FIG. 2H, to form the conductive fill material 253 without undesired voids or seams. In an example, the thickness 235 at the bottom portion 220 is increased at a rate greater than the thickness 254 at the corner portion 218 (e.g., including the thickness reflowing from the sidewall and corner portions 231, 218), thus providing a relatively bottom-up deposition process to fill the opening 212 with the bulk layer 250 without undesired early closure or voids/seams formed in the opening 212.

It is believed that the high temperature control of the substrate (or referred as the high temperature setting to the heating device of the substrate support pedestal) may provide thermal energy to the substrate, which may enable the reflowing process while continuing depositing the metal elements. By supplying the thermal energy to the substrate at relatively later stages (at the second and third operation stages 106(b), 106(c) rather than the first operation stage 106(a) in the beginning of the deposition process), the early agglomeration of the metal elements, which is often found in the conventional process, may be eliminated, thus rendering a uniform and conformal deposition profile to enable a successful deposition process of the conductive fill material 253 in the opening 212.

Additionally, unlike the low RF bias power regime P1 and the high RF bias power regime P2 regulated at first operation stage 106(a), as shown in FIG. 3B, the bias power P3 controlled at the third operation stage 106(c) is controlled at medium bias power regime, such as in a range from about 150 Watts to about 300 Watts, such as from about 200 Watts to about 250 Watts, as shown in FIG. 3B. For example, in FIG. 3B, the bias power P2 is greater than the bias power P3, and the bias power P3 is greater than the bias power P1. It is believed that the medium bias power regime may assist depositing the metal elements into the openings with a good balance of a depositing-sputtering-depositing effect so as to deposit metal elements into the opening 212, as well as allowing the reflowing of the metal elements without overly sputtering off from the substrate 201.

When forming the bulk layer 250 at the third operation stage 106(c), other than the process parameters of the temperature control and the bias power control to the substrate support pedestal, other process parameters regulated at third operation stage 106(c) are substantially similar to the first operation stage 106(a). For example, the process gas comprising non-reactive gas, such as argon or xenon, from the first operation stage 106(a) may be resumed to be supplied to energetically impinge upon and sputter material from the target at third operation stage 106(c). The RF power source, the DC power source, the pulsed DC power source, or the combined power source using RF power and/or DC power or pulsed DC power to apply energy to the target to dislodge materials from the target may be implemented. In an example, the non-reactive gas may be supplied at a volumetric flow rate in a range from about 1 sccm to about 50 sccm, such as about 1 sccm and about 20 sccm, during deposition while the power of the RF power source in a range from about 20 Watts to about 800 Watts may be applied to the target during deposition. It is noted that the process parameters discussed herein are based on a 300 mm substrate. It is contemplated that these process parameters may vary depending upon the thickness of the layers to be formed, the size of the openings, the size of the substrate, the capability of the plasma reactor, and/or the application.

The deposition and the reflowing process at the third operation stage 106(c) may be continuously performed, for example, until a thickness 259 of the conductive fill material 253 from the surface 228 of the liner layer 216 has reached to a range from about 500 Å to 700 Å, such as at least about 600 Å. The process time at third operation stage 106(c) can be in a range from about 30 seconds to about 300 seconds, such as from about 50 seconds to about 100 seconds.

Figure 2I:
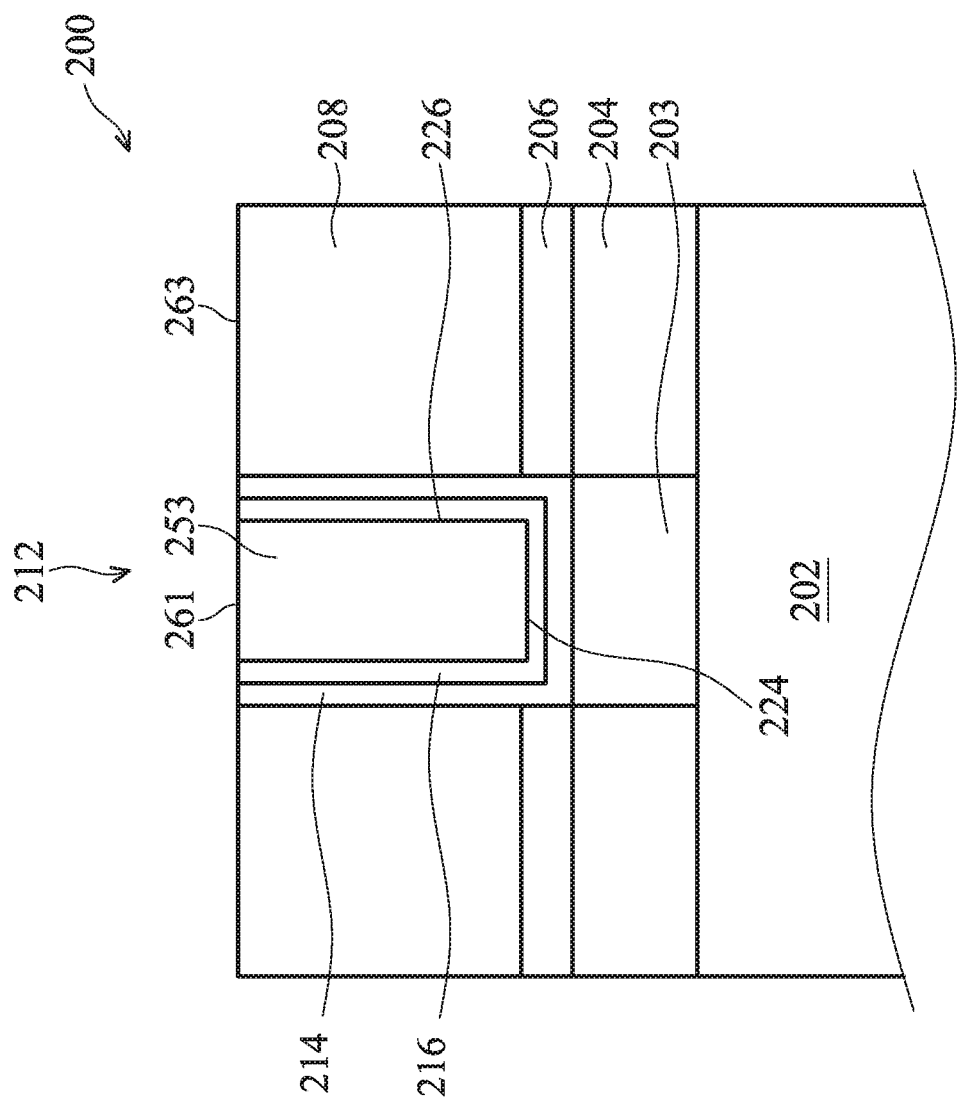

At operation 108, after the conductive fill material 253 is formed and filled in the opening 212, a chemical mechanical polish (CMP), may remove any excess conductive fill material 253, the liner layer 216, the barrier layer 214 and any remaining mask, such as the ARC 210, if any, from the substrate to have a top surface 261 of the conductive fill material 253 substantially coplanar with a top surface 263 of the second dielectric layer 208, as shown in FIG. 2I.

Figure 4:
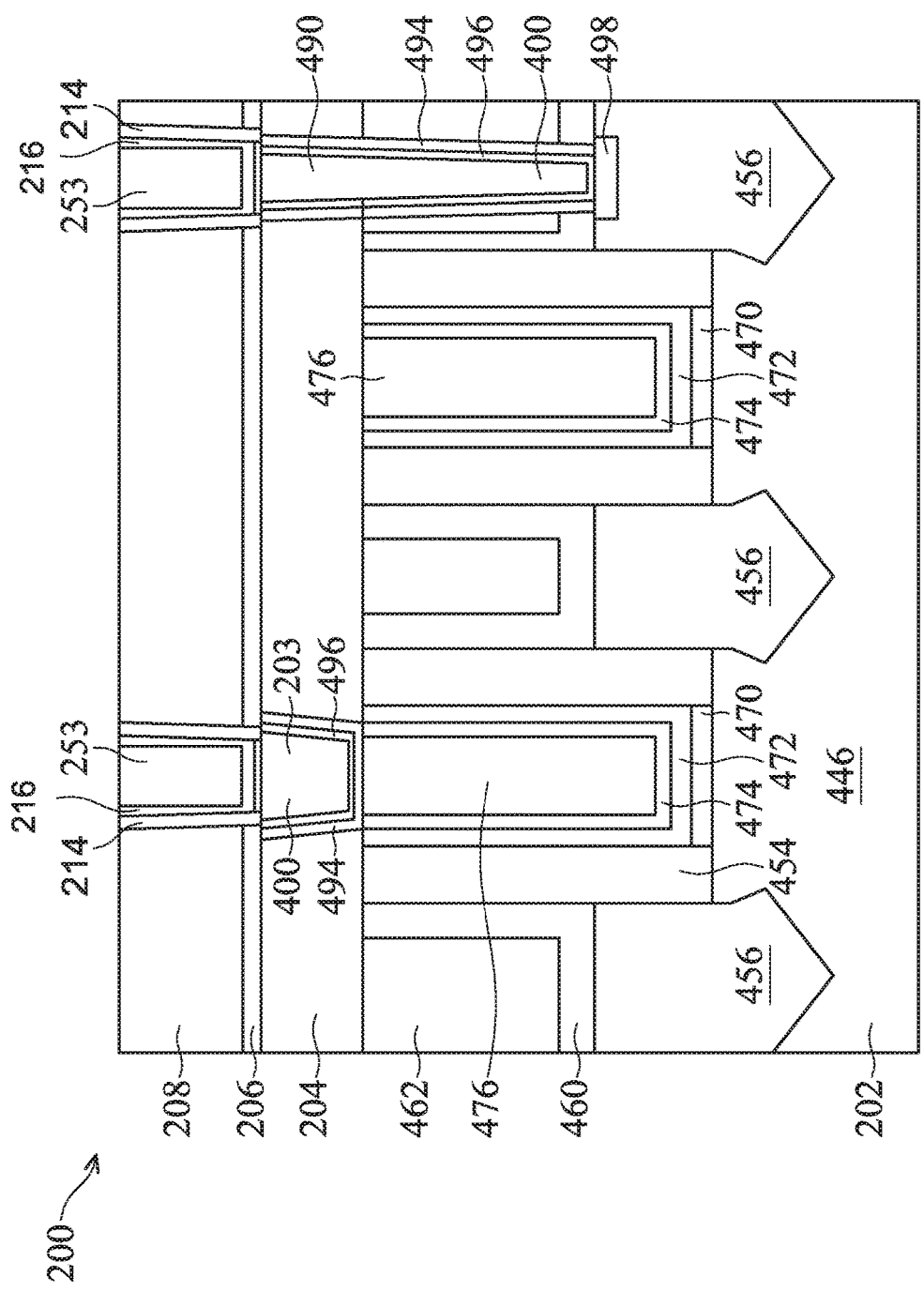
FIG. 4 illustrates a cross sectional view of a semiconductor device where a conductive feature formed by the example method of FIG. 1 may be utilized in accordance with some embodiments.

FIG. 4 depicts another example of a different location in the semiconductor device where the conductive fill material 253 formed from the process of FIG. 1 may be utilized. In the example depicted in FIG. 4, the conductive fill material 253 may be utilized to connect with the underlying conductive features 203, wherein the underlying conductive features 203 are utilized as contact plugs in a contact structure. The first dielectric layer 204 is utilized as an interlayer dielectric (ILD) having the contact plugs (e.g., the conductive features 203) formed therein.

The substrate 202 includes fin structures 446 formed on the upper portion of the substrate 202. Epitaxy source/drain regions 456 are formed in the fin structure 446. Gate structures are formed on the fin structure 446. Each gate structure includes an interfacial dielectric 470, a gate dielectric layer 472, one or more optional conformal layers 474, and a gate electrodes 476. Gate spacers 454 are formed along sidewalls of the gate structures. The interfacial dielectric 470 is along surfaces of the fin structure 446 between respective gate spacers 454. The gate dielectric layer 472 is conformally on the interfacial dielectric 470 and along sidewalls of and between respective gate spacers 454. The one or more optional conformal layers 474 are conformally on the gate dielectric layer and can include one or more barrier and/or capping layers and one or more work-function tuning layers. The gate electrodes 476 are on the one or more optional conformal layers 474.

A contact etch stop layer (CESL) 460 is conformally on surfaces of the epitaxy source/drain regions 456, and sidewalls of gate spacers 454. A first interlayer dielectric (ILD) 462 is over the CESL 460. The first dielectric layer 204, such as the first dielectric layer 204 depicted in FIGS. 2A-2I, is formed over the first ILD 462, CESL 460, gate spacers 454, and gate structures. Conductive features 203, 490 are formed to electrically connect to the gate structure and the epitaxy source/drain region 456, respectively. The conductive feature 490 includes, in the illustrated example, an adhesion layer 494, a barrier layer 496 on the adhesion layer 494, a silicide region 498 on the epitaxy source/drain region 456, and conductive fill material 400 on the barrier layer 496, for example. The conductive feature 203 includes, in the illustrated example, an adhesion layer 494, a barrier layer 496 on the adhesion layer 494, and conductive fill material 400 on the barrier layer 496, for example.

The etch stop layer 206 is on the first dielectric layer 204 and the conductive features 490, 203. The second dielectric layer 208 is on the etch stop layer 206. Conductive features (including the barrier layer 214, the liner layer 216 on the barrier layer 214, and the conductive fill material 253 on the liner layer 216) are formed through the second dielectric layer 208 and the etch stop layer 206 and electrically connected to the conductive features 203, 490.

Implementations of the present disclosure provide methods for forming a conductive fill material (e.g., a conductive feature) by a physical vapor deposition (PVD) process. The conductive fill material is formed by supplying different thermal energy to the substrate at the different manufacturing stages of the physical deposition process to enable a deposition process as well as reflowing process for forming the conductive fill material. The temperature control to the substrate may be less than 50 degrees Celsius (such as room temperature) to high temperature (such as between 90 degrees Celsius and 400 degrees Celsius), along with control of the bias power supplied during the deposition process. By doing so, a conductive fill material formation process with minimum void/seams formed in a high aspect ratio opening with high gap fill performance is obtained. Furthermore, by utilizing the physical vapor deposition to form the conductive fill material, a copper seed layer, conventionally used prior to a copper electroplating (e.g., a wet process) process may be eliminated, providing winder process window to fill the barrier layer, liner layer as well as the conductive fill material in the dielectric layer.

In one embodiment, a method of forming a conductive fill material on a substrate includes maintaining a substrate at a first substrate temperature in a first range for a first period of time while forming a pre-layer of a conductive fill material on the substrate, providing thermal energy to the substrate to maintain the substrate at a second substrate temperature in a second range for a second period of time, wherein the second substrate temperature is higher than the first substrate temperature, and continuously providing the thermal energy to the substrate to maintain the substrate at a third substrate temperature in a third range for a third period of time while forming a bulk layer of the conductive fill material on the substrate. In an embodiment, the third substrate temperature is greater than first substrate temperature. In an embodiment, the third substrate temperature is less than the second substrate temperature. In an embodiment, when providing the thermal energy to the substrate to maintain the substrate at the second substrate temperature, a first bias power is applied to a substrate support pedestal where the substrate is positioned and subsequently a second bias power is applied to the substrate support pedestal, and the second bias power is greater than the first bias power. In an embodiment, when continuously providing the thermal energy to the substrate to maintain the substrate at the third substrate temperature, a third bias power is applied to the substrate support pedestal, and the third bias power is greater than the first bias power but less than the second bias power. In an embodiment, when providing the thermal energy to the substrate to maintain the substrate at the second substrate temperature, the pre-layer is reflown on the substrate while maintaining the substrate at the second substrate temperature. In an embodiment, when reflowing the pre-layer, thickness conformity of the pre-layer is increased. In an embodiment, the pre-layer has a thickness in a range from 100 Å to 250 Å and the conductive fill material has a thickness in a range from 500 Å to 700 Å. In an embodiment, when maintaining the first substrate temperature in the first range, the substrate temperature is maintained in a range from 5 degrees Celsius to 50 degrees Celsius. In an embodiment, when providing the thermal energy to the substrate to maintain the substrate at the second substrate temperature, a heating device of a substrate support pedestal on which the substrate is positioned is controlled at a temperature in a range from 200 degrees to 400 degrees Celsius. In an embodiment, when continuously providing the thermal energy to the substrate to maintain the substrate at the third substrate temperature, a heating device of a substrate support pedestal on which the substrate is positioned is controlled at a temperature in a range from 90 degrees to 200 degrees Celsius. In an embodiment, when maintaining the substrate at the first substrate temperature in the first range, a material is sputtered from a target in a processing chamber where the substrate is positioned to form the pre-layer of the conductive fill material on the substrate. In an embodiment, when continuously providing the thermal energy to the substrate to maintain the substrate at the third substrate temperature, a material is sputtered from a target in a processing chamber where the substrate is positioned to form the bulk layer of the conductive fill material on the substrate.

In another embodiment, a method of forming a conductive fill material on a substrate includes forming a pre-layer of a conductive metal fill layer in a dielectric layer by controlling the substrate at a first substrate temperature, reflowing the pre-layer by maintaining the substrate at a second substrate temperature, wherein the second substrate temperature is greater than the first substrate temperature, and forming a bulk layer on the pre-layer by maintaining the substrate at a third substrate temperature, wherein the third substrate temperature is greater than the first substrate temperature. In an embodiment, when forming the pre-layer, a material is sputtered from a target in a processing chamber where the substrate is positioned while maintaining the substrate is at the first substrate temperature. In an embodiment, a first bias power is applied to a substrate support pedestal disposed in the processing chamber where the substrate is placed to form the pre-layer, and a second bias power is applied to the substrate support pedestal to continue forming the pre-layer, wherein the second bias power is greater than the first bias power. In an embodiment, when forming the bulk layer, a third bias power is applied to the substrate support pedestal to form the bulk layer, and the third bias power is greater than the first bias power but less than the second bias power. In an embodiment, when applying the third bias power, a material is sputtered from the target in the processing chamber where the substrate is positioned while maintaining the substrate at the third substrate temperature.

In yet another embodiment, an interconnection structure includes a barrier layer comprising a first metal containing material in a dielectric material, a liner layer comprising a second metal containing material on the barrier layer in the dielectric material, and a metal fill material comprising a third metal containing material on the liner layer in the dielectric material, wherein a top surface of the metal fill material is substantially coplanar with a top surface of the dielectric material, wherein the third metal containing material is different from at least one of the first and the second metal containing materials. In an embodiment, the first metal containing material comprises a titanium containing layer or a tantalum containing material, and the second metal containing material comprises a ruthenium or cobalt material and the third metal containing material comprises a copper material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method of forming a conductive fill material on a substrate, comprising:
maintaining the substrate at a first substrate temperature in a first range for a first period of time while forming a pre-layer of the conductive fill material along sidewalls and a bottom of an opening in a dielectric layer over the substrate;
providing thermal energy to the substrate to maintain the substrate at a second substrate temperature in a second range for a second period of time, wherein the second substrate temperature is higher than the first substrate temperature, wherein providing the thermal energy reflows the pre-layer to fill a lower portion of the opening while an upper portion of the opening is free of the pre-layer; and
continuously providing the thermal energy to the substrate to maintain the substrate at a third substrate temperature in a third range for a third period of time while forming a bulk layer of the conductive fill material to fill the upper portion of the opening.

2. The method of claim 1, wherein the third substrate temperature is greater than the first substrate temperature.

3. The method of claim 1, wherein the third substrate temperature is less than the second substrate temperature.

4. The method of claim 1, wherein forming the pre-layer of the conductive fill material on the substrate further comprises:
applying a first bias power to a substrate support pedestal where the substrate is positioned; and
subsequently applying a second bias power to the substrate support pedestal, wherein the second bias power is greater than the first bias power.

5. The method of claim 4, wherein continuously providing the thermal energy to the substrate to maintain the substrate at the third substrate temperature further comprises:
applying a third bias power to the substrate support pedestal, wherein the third bias power is greater than the first bias power but less than the second bias power.

6. The method of claim 1, wherein providing the thermal energy to the substrate to maintain the substrate at the second substrate temperature further comprises:
reflowing the pre-layer formed on the substrate while maintaining the substrate at the second substrate temperature.

7. The method of claim 6, wherein reflowing the pre-layer further comprises:
increasing thickness conformity of the pre-layer.

8. The method of claim 1, wherein the pre-layer has a thickness in a range from 100 Å to 250 Å and the conductive fill material has a thickness in a range from 500 Å to 700 Å.

9. The method of claim 1, wherein maintaining the substrate at the first substrate temperature in the first range further comprises:
maintaining the substrate temperature in a range from 5 degrees Celsius to 50 degrees Celsius.

10. The method of claim 1, wherein providing the thermal energy to the substrate to maintain the substrate at the second substrate temperature further comprises:
controlling a heating device of a substrate support pedestal on which the substrate is positioned at a temperature in a range from 200 degrees to 400 degrees Celsius.

11. The method of claim 1, wherein continuously providing the thermal energy to the substrate to maintain the substrate at the third substrate temperature further comprises:
controlling a heating device of a substrate support pedestal on which the substrate is positioned at a temperature in a range from 90 degrees to 200 degrees Celsius.

12. The method of claim 1, wherein maintaining the substrate at the first substrate temperature in the first range further comprises:
sputtering a material from a target in a processing chamber where the substrate is positioned to form the pre-layer of the conductive fill material on the substrate.

13. The method of claim 1, wherein continuously providing the thermal energy to the substrate to maintain the substrate at the third substrate temperature further comprises:
sputtering a material from a target in a processing chamber where the substrate is positioned to form the bulk layer of the conductive fill material on the substrate.

14. A method of forming a conductive fill material on a substrate, comprising:
forming a pre-layer of the conductive fill material in a dielectric layer by controlling the substrate at a first substrate temperature;
reflowing the pre-layer by maintaining the substrate at a second substrate temperature, wherein the second substrate temperature is greater than the first substrate temperature; and
forming a bulk layer of the conductive fill material on the pre-layer by maintaining the substrate at a third substrate temperature, wherein the third substrate temperature is greater than the first substrate temperature, wherein the bulk layer extends into the dielectric layer.

15. The method of claim 14, wherein forming the pre-layer further comprises:

sputtering a material from a target in a processing chamber where the substrate is positioned while maintaining the substrate at the first substrate temperature.

16. The method of claim 15, further comprising:
applying a first bias power to a substrate support pedestal disposed in the processing chamber where the substrate is placed to form the pre-layer; and
applying a second bias power to the substrate support pedestal to continue forming the pre-layer, wherein the second bias power is greater than the first bias power.

17. The method of claim 16, wherein forming the bulk layer further comprises:
applying a third bias power to the substrate support pedestal to form the bulk layer, wherein the third bias power is greater than the first bias power but less than the second bias power.

18. The method of claim 17, wherein applying the third bias power further comprises:
sputtering the material from the target in the processing chamber where the substrate is positioned while maintaining the substrate at the third substrate temperature.

19. A method comprising:
forming an opening in a dielectric layer disposed over a substrate, the opening exposing an underlying electrically conductive feature;
forming a barrier layer along sidewalls of the dielectric layer exposed by the opening and along an upper surface of the electrically conductive feature; and
filling the opening with an electrically conductive fill material, wherein filling the opening comprises:
forming a pre-layer of the electrically conductive fill material in the opening over the barrier layer at a first temperature;
reflowing the pre-layer at a second temperature higher than the first temperature; and
forming a bulk layer of the electrically conductive fill material in the opening over the pre-layer at a third temperature after reflowing the pre-layer, the third temperature being higher than the first temperature.

20. The method of claim 19, wherein forming the pre-layer further comprises:
depositing the pre-layer while applying a first bias power to a substrate support pedestal on which the substrate is positioned; and
subsequently, continue depositing the pre-layer while applying a second bias power higher than the first bias power to the substrate support pedestal.

* * * * *